(12) United States Patent
Lee et al.

(10) Patent No.: US 12,232,260 B2
(45) Date of Patent: Feb. 18, 2025

(54) ELECTRONIC DEVICE HAVING MULTILAYERED SUBSTRATE AND MANUFACTURING METHOD THEREOF

(71) Applicant: SAMSUNG ELECTRONICS CO., LTD., Suwon-si (KR)

(72) Inventors: Seungjin Lee, Gyeonggi-do (KR); Jonghoon Kim, Seoul (KR); Kyoungsun Kim, Gyeonggi-do (KR); Sungjoo Park, Gyeonggi-do (KR); Jinseong Yun, Gyeonggi-do (KR); Young-Ho Lee, Seoul (KR); Jeonghyeon Cho, Gyeonggi-do (KR); Heejin Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 17/939,546

(22) Filed: Sep. 7, 2022

(65) Prior Publication Data
US 2023/0300984 A1    Sep. 21, 2023

(51) Int. Cl.
*H05K 1/11* (2006.01)
*H05K 1/02* (2006.01)
*H05K 3/40* (2006.01)

(52) U.S. Cl.
CPC .......... *H05K 1/116* (2013.01); *H05K 1/0298* (2013.01); *H05K 3/4038* (2013.01); *H05K 2201/09627* (2013.01)

(58) Field of Classification Search
CPC .... H05K 1/116; H05K 1/0298; H05K 3/4038; H05K 2201/09627
(Continued)

(56) References Cited

U.S. PATENT DOCUMENTS 3,662,294 A * 5/1972 Jacobs ................... H03H 7/383
                                                       333/202
4,176,332 A * 11/1979 Bachert ................. H03B 19/14
                                                       327/119
(Continued)

FOREIGN PATENT DOCUMENTS

| JP | 2000-101303 | 4/2000 |
|---|---|---|
| JP | 6362057 | 7/2018 |

(Continued)

OTHER PUBLICATIONS

Huang et al., "Stub Effect Mitigations Using Absorbing Materials", IEEE Transactions on Components, Packaging and Manufacturing Technology, vol. 6, No. 8, Aug. 2016, pp. 1233-1244.

*Primary Examiner* — Timothy J Thompson
*Assistant Examiner* — Michael F McAllister
(74) *Attorney, Agent, or Firm* — F. CHAU & ASSOCIATES, LLC

(57) ABSTRACT

An electronic device includes: a multilayered base substrate including a plurality of substrate bases stacked on each other; a first conductive via and a second conductive via penetrating the substrate bases and spaced from each other; a conductive line electrically connecting the first conductive via and the second conductive via to each other and disposed on at least one of the substrate bases of the plurality of substrate bases; and an open stub including a first end and a second end, wherein the first end is connected to a connector of the conductive line, and the second end is opened.

20 Claims, 16 Drawing Sheets

(58) Field of Classification Search
USPC .......................................................... 174/261
See application file for complete search history.

(56) References Cited

U.S. PATENT DOCUMENTS

| | | | | |
|---|---|---|---|---|
| 4,518,931 | A * | 5/1985 | Rauscher | H03B 5/1852 |
| | | | | 331/76 |
| 4,642,590 | A * | 2/1987 | Buijs | H03K 5/00006 |
| | | | | 327/119 |
| 4,736,168 | A * | 4/1988 | Nagata | H03B 5/1876 |
| | | | | 331/117 FE |
| 4,754,229 | A * | 6/1988 | Kawakami | H03F 3/601 |
| | | | | 455/317 |
| 5,023,866 | A * | 6/1991 | De Muro | H01P 1/2056 |
| | | | | 370/290 |
| 5,467,063 | A * | 11/1995 | Burns | H01P 5/12 |
| | | | | 333/33 |
| 5,563,551 | A * | 10/1996 | Kashiwa | H03F 3/601 |
| | | | | 330/277 |
| 6,198,365 | B1 * | 3/2001 | Yamada | H03B 19/14 |
| | | | | 327/119 |
| 6,388,546 | B1 * | 5/2002 | Kikokawa | H03B 19/18 |
| | | | | 327/119 |
| 6,661,092 | B2 | 12/2003 | Shibata et al. | |
| 8,884,644 | B1 * | 11/2014 | Ben Artsi | H01P 3/026 |
| | | | | 327/108 |
| 9,035,714 | B2 * | 5/2015 | Mantiply | H01L 23/642 |
| | | | | 333/32 |
| 9,660,340 | B2 | 5/2017 | Yokoyama et al. | |
| 9,872,398 | B1 | 1/2018 | Doyle et al. | |
| 10,524,351 | B2 | 12/2019 | Zhang et al. | |
| 11,784,616 | B2 * | 10/2023 | Chang | H03F 3/195 |
| | | | | 330/302 |
| 11,855,650 | B2 * | 12/2023 | Kang | H03K 5/00006 |
| 2002/0118075 | A1 | 8/2002 | Ohwada et al. | |
| 2003/0025487 | A1 * | 2/2003 | Jian | H03F 3/193 |
| | | | | 324/95 |
| 2004/0125526 | A1 * | 7/2004 | Nagode | H01P 5/02 |
| | | | | 257/E27.048 |
| 2007/0178766 | A1 * | 8/2007 | Banerjee | H05K 1/025 |
| | | | | 439/638 |
| 2007/0229184 | A1 * | 10/2007 | Liu | H01P 3/08 |
| | | | | 333/100 |
| 2012/0282749 | A1 | 11/2012 | Gaucher et al. | |
| 2014/0009242 | A1 * | 1/2014 | Mantiply | H03H 7/38 |
| | | | | 333/33 |
| 2014/0016686 | A1 * | 1/2014 | Ben Artsi | H03H 7/38 |
| | | | | 333/33 |
| 2015/0222461 | A1 | 8/2015 | Motoi et al. | |
| 2015/0311589 | A1 | 10/2015 | Yokoyama et al. | |
| 2016/0181678 | A1 | 6/2016 | Robert et al. | |
| 2019/0348974 | A1 * | 11/2019 | Bao | H03H 7/0115 |

FOREIGN PATENT DOCUMENTS

| | | |
|---|---|---|
| KR | 10-2001-0108226 A | 12/2001 |
| KR | 10-0873163 B1 | 12/2008 |
| KR | 10-2013-0112080 A | 10/2013 |
| KR | 10-1515857 B1 | 5/2015 |
| KR | 10-1659827 B1 | 9/2016 |

* cited by examiner

FIG. 8
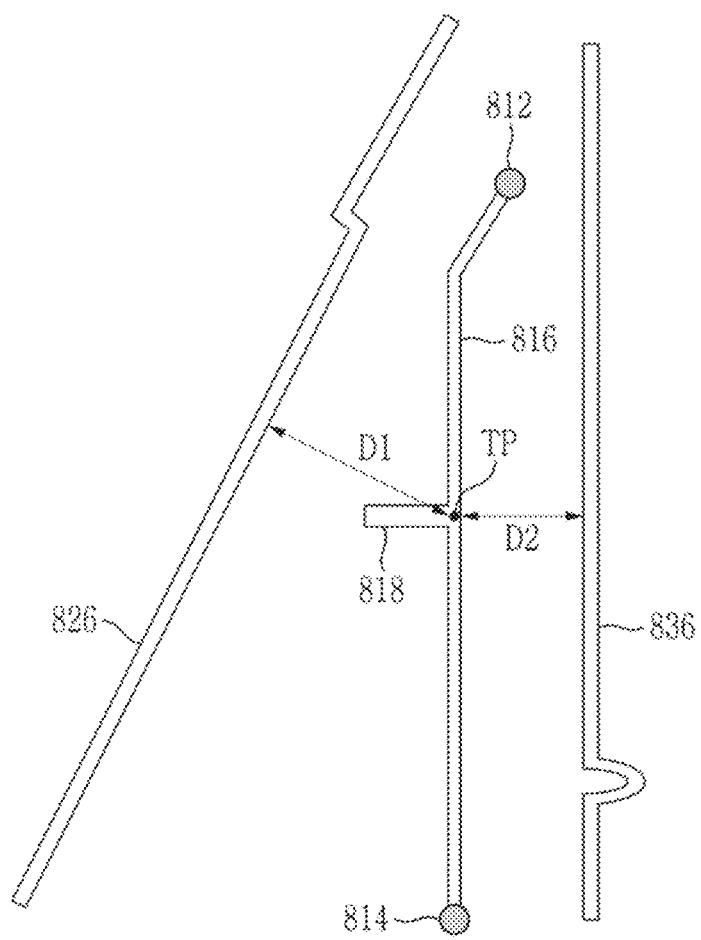
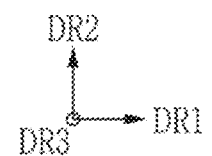

ELECTRONIC DEVICE HAVING MULTILAYERED SUBSTRATE AND MANUFACTURING METHOD THEREOF

CROSS-REFERENCE TO RELATED APPLICATION

This application claims priority under 35 U.S.C. § 119 to Korean Patent Application No. 10-2022-0034049 filed in the Korean Intellectual Property Office on Mar. 18, 2022, the disclosure of which is incorporated by reference herein in its entirety.

TECHNICAL FIELD

The present disclosure relates to an electronic device with a multilayered substrate and a manufacturing method thereof.

DISCUSSION OF THE RELATED ART

As demands for circuits with increased integration and decreased size increase, multilayered boards, which have multilayered insulation substrates and patterned conductive lines between the multilayered insulation substrates, are under development. Electronic components are mounted on the multilayered insulation substrates, and the electronic components are electrically connected to the conductive lines. Electrical signals are transmitted to the electronic components through the conductive lines. Recently, integration of the electronic components on the multilayered board is increasing, and hence, the conductive lines for transmitting signals are also integrated and are becoming finer.

SUMMARY

According to an embodiment, an electronic device includes: a multilayered base substrate including a plurality of substrate bases stacked on each other; a first conductive via and a second conductive via penetrating the substrate bases and spaced from each other; a conductive line electrically connecting the first conductive via and the second conductive via to each other and disposed on at least one of the substrate bases of the plurality of substrate bases; and an open stub including a first end and a second end, wherein the first end is connected to a connector of the conductive line, and the second end is opened.

According to an embodiment, an electronic device includes: a base substrate including a plurality of substrate bases stacked on each other; at least one semiconductor chip attached to a first side of the base substrate; and a conductive pattern connected to the at least one semiconductor chip and having a low pass filter, wherein the low pass filter includes: a first conductive via and a second conductive via penetrating the plurality of substrate bases, a conductive line disposed between adjacent substrate bases, of the plurality of substrate bases, that are stacked on each other, wherein the conductive line electrically connects the first conductive via and the second conductive via to each other, and at least one open stub including a first end and a second end, wherein the first end is connected to the conductive line at a connector at which the conductive line is divided into substantially equivalent lengths, wherein the second end is opened.

According to an embodiment, a method for manufacturing an electronic device includes: providing a base substrate including a plurality of substrate bases, wherein a conductive line is formed on a substrate base of the plurality of substrate bases; and forming conductive vias penetrating the base substrate and connected to respective ends of the conductive line, wherein the conductive line is connected to an open stub of which a first end is opened in substantially a middle of the conductive line.

BRIEF DESCRIPTION OF THE DRAWINGS

FIG. 8 shows a layout of conductive patterns on a base substrate of an electronic device according to an embodiment.

DETAILED DESCRIPTION OF THE EMBODIMENTS

Figure 1:
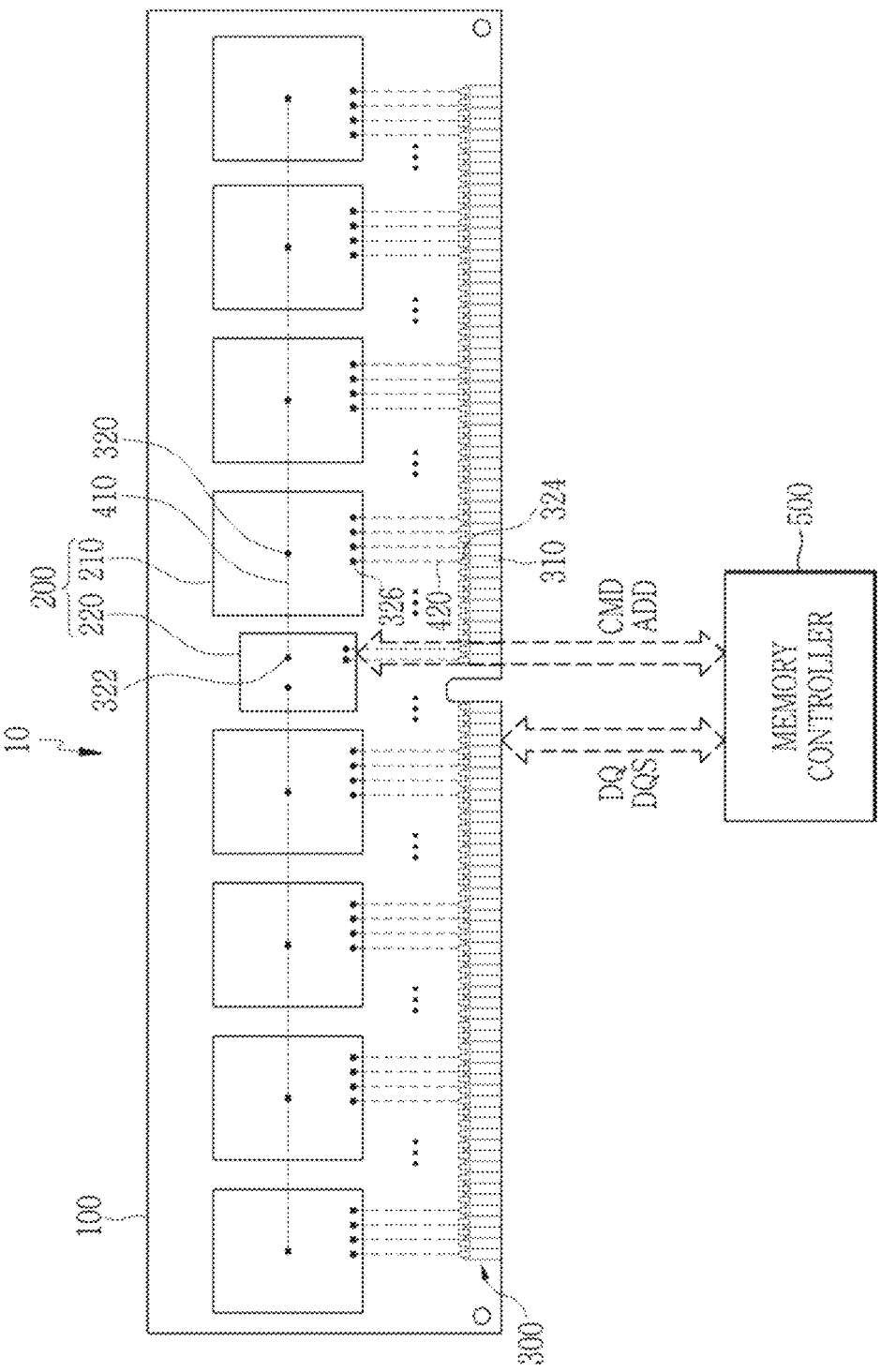
FIG. 1 shows a plan layout view of components of an electronic device according to an embodiment.

Hereinafter, embodiments will be described in detail with reference to the attached drawings. The present invention may be embodied in many different forms, and should not be construed as limited to the exemplary embodiments set forth herein.

Like reference numerals may designate like elements throughout the specification. In the flowcharts described with reference to the drawings in this specification, the operation order may be changed, various operations may be merged, certain operations may be divided into multiple operations, and certain operations might not be performed.

In the drawings, various thicknesses, lengths, and angles are shown and while the arrangement shown does indeed represent an embodiment, it is to be understood that modifications of the various thicknesses, lengths, and angles may be possible within the spirit and scope and the present invention is not necessarily limited to the particular thicknesses, lengths, and angles shown.

It will be understood that when an element such as a layer, film, region, or substrate is referred to as being "on" another element, it can be directly on the other element or intervening elements may also be present. In contrast, when an element is referred to as being "directly on" another element, there are no intervening elements present between the element and the other element. The word "on" or "above" means positioned on or below the object portion, and does not necessarily mean positioned on the upper side of the object portion based on a gravitational direction.

The phrase "on a plane" means viewing the object portion from the top unless indicated otherwise, and the phrase "on a cross-section" means viewing a cross-section of which the object portion is vertically cut from the side.

An electronic device and a method for manufacturing the same according to an embodiment will now be described with reference to accompanying drawings.

FIG. 1 shows a plan layout view of components of an electronic device according to an embodiment.

Referring to FIG. 1, the electronic device 10 includes a base substrate 100, a plurality of semiconductor chips 200 attached to the base substrate 100, and an input/output portion 300.

According to an embodiment, the base substrate 100 may be a printed circuit board PCB. For example, the base substrate 100 may be a multilayered PCB. A plurality of conductive patterns 410 and 420 may be disposed on the base substrate 100. For example, conductive patterns 410 and 420 may be positioned on one side and/or both sides of layers in the base substrate 100. According to an embodiment, the conductive patterns 410 and 420 may be disposed on an upper side and/or a lower side of the base substrate 100.

The semiconductor chips 200 may be mounted on the base substrate 100. For example, a plurality of semiconductor chips 200 may be mounted on the base substrate 100 by using wires, lead frames, and/or solder balls. The semiconductor chips 200 may be spaced from each other. The semiconductor chips 200 may be electrically connected to the conductive patterns 410 and 420 of the base substrate 100.

The semiconductor chips 200 may include a plurality of memory semiconductor chips 210 and at least one controller chip 220.

The memory semiconductor chips 210 may be volatile memory devices and/or non-volatile memory devices. The volatile memory devices may, for example, be dynamic RAMs (DRAM), static RAMs (SRAM), synchronous DRAMs (SDRAM), double data rates (DDR) RAMs, or Rambus DRAMs (RDRAM), and the present invention is not limited thereto. The non-volatile memory devices may be flash memories, phase-change RAMs (PRAM), resistive RAMs (RRAM), ferroelectric RAMs (FeRAM), or magnetic RAMs (MRAM), and the present invention is not limited thereto. The flash memories may, for example, be NAND flash memories. The flash memories may, for example, be V-NAND flash memories. The non-volatile memory devices may be made of a semiconductor die, or may be a stack of multiple semiconductor dies.

The controller chip 220 may control the memory semiconductor chips 210. For example, a controller may be installed in the controller chip 220. The controller may control access to data stored in the memory semiconductor chips 210. The controller may control access to the memory cell of the memory semiconductor chips 210 and writing and/or reading operations according to signal (e.g., commands (CMD), addresses (ADD), control signals, and clock signals) transmitted from an external host. The controller may be configured with an application specific integrated circuit (ASIC). For example, when the electronic device 10 is connected to the external host, the controller may be designed to be automatically executed by an operating system of the external host.

The controller chip 220 may be a buffer chip such as a register clock driver (RCD). The buffer chip may buffer the signal (e.g., commands (CMD), addresses (ADD), control signals, and clock signals) transmitted from the external host and may provide the same to the memory semiconductor chips 210.

The controller chip 220 may include data buffers that are connected to corresponding memory semiconductor chips 210. The data buffer may buffer data input/output signals that are input/output to/from the memory semiconductor chips 210. The data buffers may be positioned between the memory semiconductor chips 210 and the input/output portion 300.

The input/output portion 300 may include a plurality of input/output terminals 310. The input/output portion 300 is shown to be a connector, and is not limited thereto. The input/output terminals 310 may transmit/receive electrical signals (e.g., commands (CMD), addresses (ADD), control signals, dock signals, data signals (DQ), data strobe signals (DQS), etc.,) to/from an external device. For example, one side of the input/output terminals 310 may be inserted into a mother board socket and may be electrically connected to the mother board. Another side of the input/output terminals 310 may be electrically connected to the conductive patterns 410 and 420 of the base substrate 100. The input/output terminals 310 may be directly connected to a mother board slot, and may be directly/indirectly connected to the conductive patterns 410 and 420 of the base substrate 100. Commands/address signal input pins, no connection pins, and data input/output signal pins may be allocated to the input/output terminals 310.

The conductive patterns 410 may electrically connect spaces among the semiconductor chips 200, and the conductive patterns 420 may electrically connect spaces among the input/output terminals 310 and the semiconductor chips 200. For example, the conductive patterns 410 may electrically connect semiconductor chips 200 to each other, and the conductive patterns 420 may electrically connect input/output terminals 310 to corresponding semiconductor chips 200.

As the conductive patterns 410 and 420 are positioned on internal layers of the base substrate 100, the conductive patterns 410 and 420 are connected to the semiconductor chip 200 and/or the input/output terminals 310 through vias. For example, the semiconductor chip 200 may be electrically connected to the conductive patterns 410 and 420 through conductive vias 320 and 322 penetrating part of the base substrate 100. The input/output terminal 310 may be electrically connected to the conductive pattern 420 through conductive vias 324 and 326 penetrating part of the base substrate 100. For example, an input/output end of the memory semiconductor chip 210 is connected to a pad connected to the conductive via 326, and the input/output terminal 310 is connected to the conductive via 324 so the input/output end of the memory semiconductor chip 210 and the input/output terminal 310 may be electrically connected to the conductive pattern 420.

There may be a problem in that the via stub, which remains after the conductive vias 320, 322, 324, and 326 are connected to the conductive patterns 410 and 420, acts as a capacitor for a high-frequency signal, causing signal reflection, and reducing a channel bandwidth.

Compared to this, open stubs are included in the conductive patterns 410 and 420 of the electronic device according to an embodiment of the present inventive concept. The conductive patterns 410 and 420 may configure a low pass filter LPF by the open stubs and the via stubs. For example, by forming the open stubs, influences caused by the via stubs may be removed, and signal transmission characteristics in a low frequency bandwidth may be improved.

The conductive patterns 410 and 420 with a $3^{rd}$-order low pass filter will now be described in detail with reference to FIG. 2 to FIG. 4.

Figure 2:
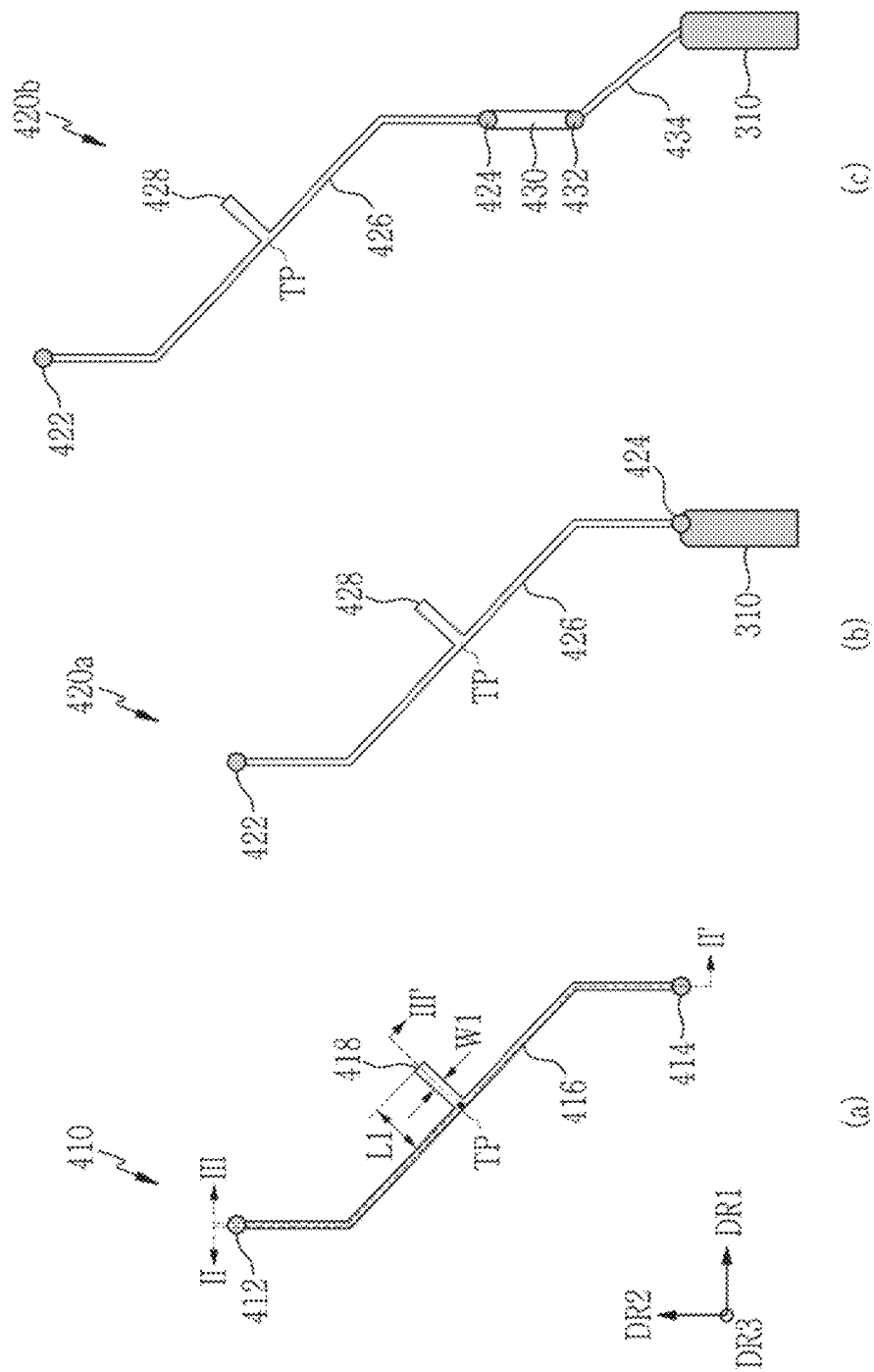
FIG. 2 shows a layout of conductive patterns on a base substrate of an electronic device according to an embodiment.

FIG. 2 shows a layout of conductive patterns on a base substrate of an electronic device according to an embodiment.

As shown in (a) of FIG. 2, the conductive pattern 410 may include a first conductive via 412, a second conductive via 414, a conductive line 416 connected to the first conductive via 412 and the second conductive via 414, and an open stub 418 connected to the conductive line 416. Here, the first conductive via 412 and the second conductive via 414 may be connected to a plurality of semiconductor chips 200.

For example, the conductive line 416 and the open stub 418 may be configured in a microstrip and/or strip line form. Here, the stub represents a piece or a strip, and is used as a term for referring to an additionally connected path for the purpose of an impedance matching as well as a signal transmission purpose in the microstrip and/or strip line circuit. When the stub is not connected to the conductive line, this may be referred to as the open stub 418, and when the stub is connected to a ground line, this may be referred to as a short-circuited stub.

The first conductive via 412 is spaced from the second conductive via 414. The conductive line 416 may be connected to the first conductive via 412 and the second conductive via 414. The first conductive via 412 and the second conductive via 414 may be connected to the conductive line 416 on a layer on which the conductive line 416 is positioned.

The open stub 418 is connected to a connector TP of the conductive line 416 between the first conductive via 412 and the second conductive via 414. For example, the connector TP and the open stub 418 are positioned between the first conductive via 412 and the second conductive via 414. A first end of the open stub 418 is connected to the connector TP, and a second end thereof may be opened. For example, the open stub 418 might not be connected to other elements on the base substrate 100, but may be connected to the conductive line 416. The open stub 418 may extend in a direction different from which the conductive line 416 extends. For example, the open stub 418 may be substantially perpendicular to the conductive line 416.

The connector TP may be substantially positioned in the middle of the conductive line 416. For example, when a width of the conductive line 416 is substantially constant, the connector TP may be a point for substantially dividing the conductive line 416 into two equal portions. A length of the conductive line 416 between the first conductive via 412 and the connector TP may be substantially equivalent to a length of the conductive line 416 between the second conductive via 414 and the connector TP. An impedance value of the conductive line 416 between the connector TP and the first conductive via 412 may be substantially equivalent to an impedance value of the conductive line 416 between the connector TP and the second conductive via 414.

An impedance value of the open stub 418 relates to the impedance value of the conductive line 416. For example, the impedance value of the conductive line 416 may be a multiple of the impedance value of the open stub 418. For example, the impedance value of the open stub 418 may be about ½ of the entire impedance value of the conductive line 416. Hence, a length L1 and a width W1 of the open stub 418 relates to the impedance value of the conductive line 416. An electrical length of the open stub 418 may be less than ¼λ (λ is a wavelength corresponding to a center frequency) and greater than 0.

An input/output impedance value of the semiconductor chip 200 that is connected to the first conductive via 412 may be substantially equivalent to an input/output impedance value of the semiconductor chip 200 that connected to the second conductive via 414.

The open stub 418 may extend to cross a direction in which the conductive line 416 extends. For example, the open stub 418 may be bifurcated from the conductive line 416, The open stub 418 may be a conductive line including a same material as the conductive line 416. However, the present invention is not limited thereto. For example, the open stub 418 and the conductive line 416 may include different material from each other.

The conductive line 416 and the open stub 418 may be positioned on the same layer, and the conductive line 416 and the open stub 418 may be positioned on different layers, which will be described in a later portion of the present specification with reference to FIG. 6.

As shown in (b) of FIG. 2, the conductive pattern 420a may include a first conductive via 422, a second conductive via 424, a conductive line 426 connected to the first conductive via 422 and the second conductive via 424, and an open stub 428 connected to the conductive line 426. The second conductive via 424 may be connected to the input/output terminal 310.

As shown in (c) of FIG. 2, the conductive pattern 420b may include a first conductive via 422, a second conductive via 424, a third conductive via 432, a conductive line 426, a resistor 430, and a conductive line 434. The conductive line 426 may be connected to the first conductive via 422 and the second conductive via 424. The resistor 430 may be connected to the second conductive via 424 and the third conductive via 432, and the conductive line 434 may be connected to the third conductive via 432 and the input/output terminal 310.

Descriptions regarding the open stub 428 in (b) of FIG. 2 and (c) of FIG. 2 correspond to the above-provided description on the open stub 418 in (a) of FIG. 2, so no description regarding the open stub 428 will be provided.

In (b) of FIG. 2 and (c) of FIG. 2, the impedance value of the conductive line 426 may be equivalent to the input/output impedance value of the semiconductor chip 200 connected to the first conductive via 422 and the input/output impedance value of the input/output terminal 310 connected to the second conductive via 424.

A structure of the conductive pattern 410 will now be described with reference to FIG. 3 and FIG. 4.

Figure 3:
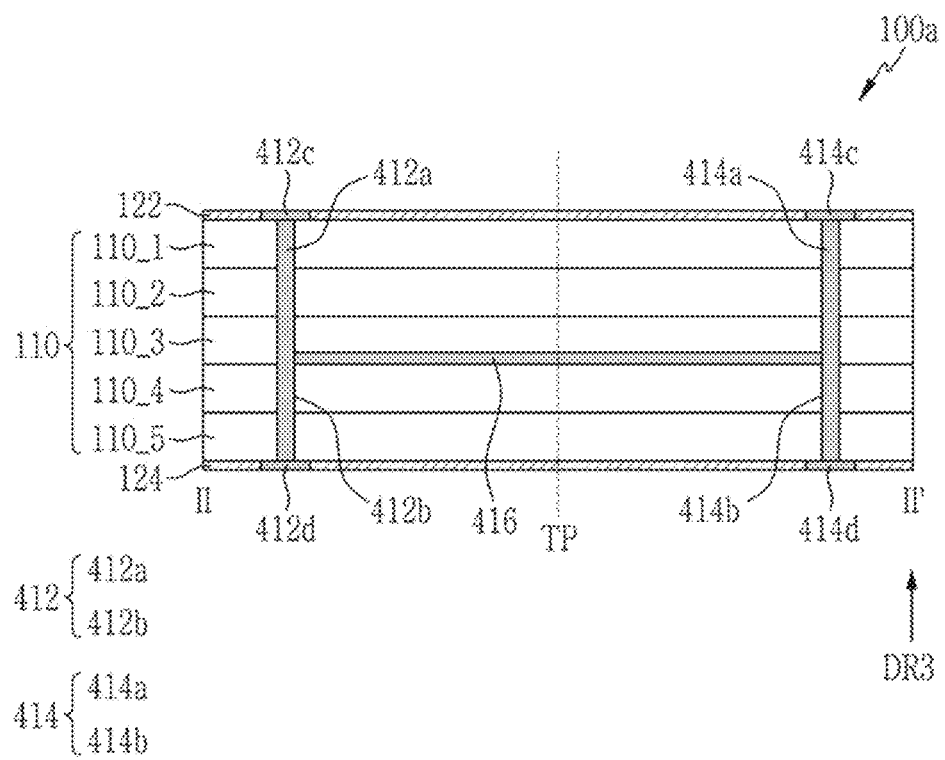
FIG. 3 shows a cross-sectional view of an electronic device of FIG. 2 with respect to a line II-II'.
Figure 4:
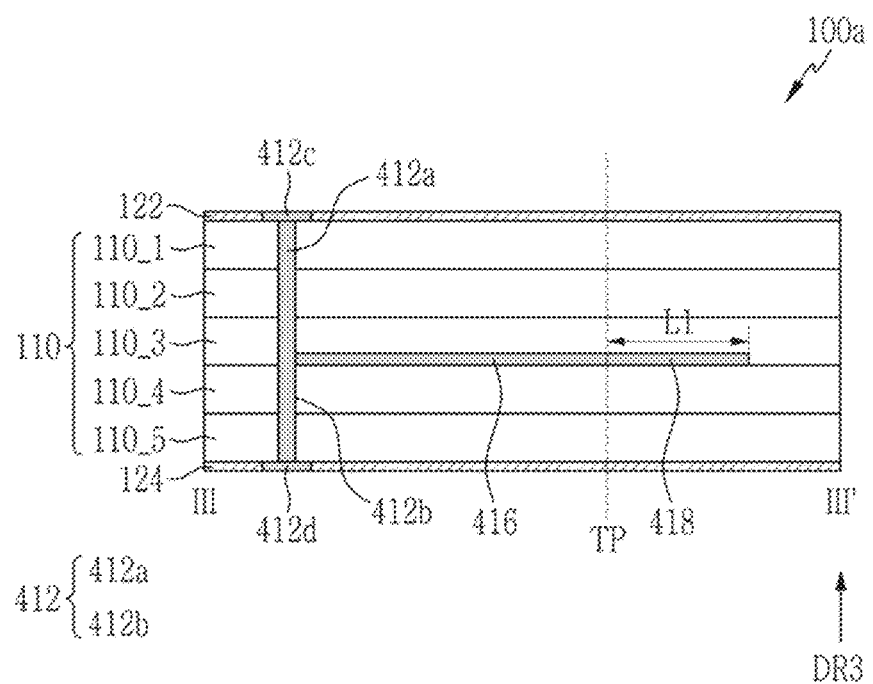
FIG. 4 shows a cross-sectional view of an electronic device of FIG. 2 with respect to a line III-III'.

FIG. 3 shows a cross-sectional view of an electronic device of FIG. 2 with respect to a line II-II', and FIG. 4 shows a cross-sectional view of an electronic device of FIG. 2 with respect to a line III-III'.

As shown in FIG. 3, conductive vias 412 and 414 and a conductive line 416, which are for electrically connecting connection pads 412c, 412d, 414c, and 414d, may be positioned on the base substrate 100a.

The base substrate 100a may include a substrate base 110. For example, the substrate base 110 may be made of at least one material of a phenol resin, an epoxy resin, and/or a polyimide.

In an embodiment, an upper side solder resist layer 122 and a lower side solder resist layer 124 for covering at least part of substrate bases 110_1 and 110_5, respectively, may be formed on an upper side and a lower side of the base substrate 100a, respectively. The connection pads 412c, 412d, 414c, 414d, 412c, and 414c, that are not covered by the upper side solder resist layer 122 and/or the lower side solder resist layer 124 and are exposed, may be disposed on the upper side and/or the lower side of the base substrate 100a. The connection pads 412c, 412d, 414c, and 414d may be electrically connected to the semiconductor chips 200 through a chip connecting member. The chip connecting member may be a solder ball or a bump, and without being limited thereto; for example, the chip connecting member may be a bonding wire.

The base substrate 100a may be a multilayered substrate on which a plurality of substrate bases 110_1, . . . , 110_5 are stacked on each other. A conductive line 416 may be positioned between two adjacent stacked substrate bases 110. For example, the conductive line 416 may be positioned between substrate base 110_3 and substrate base 110_4. In an embodiment of the present inventive concept, the conductive line 416 may be positioned between the substrate base 110_1 and the solder resist layer 122 and/or between the substrate base 110_5 and the lower side solder resist layer 124.

The connection pads 412c and 414c may be disposed on the substrate base 110_1. The connection pads 412d and 414d may be disposed on the substrate base 110_5. For example, the conductive line 416 may be disposed on the upper side of the substrate base 110_4 and the lower side of the substrate base 110_1. However, the present invention is not limited thereto; for example, the conductive line 416 may be disposed on the upper side of the substrate base 110_1 and/or the lower side of the substrate base 110_5. The conductive line 416 may be disposed on at least one of the two adjacent stacked substrate bases 110. Referring to FIG. 3, the conductive line 416 will be described to be disposed between the substrate base 110_3 and the substrate base 110_4. Also, an additional conductive line may be further positioned on the upper side of the substrate base 110_1 between the substrate base 110_1 and the substrate base 110_2, between the substrate base 110_2 and the substrate base 110_3, between the substrate base 110_3 and the substrate base 110_4, between the substrate base 110_4 and the substrate base 110_5, and on the lower side of the substrate base 110_5.

In an embodiment, a ground plane layer may be disposed on at least one of the upper side of the substrate base 110_1, between the substrate base 110_1 and the substrate base 110_2, between the substrate base 110_2 and the substrate base 110_3, between the substrate base 110_3 and the substrate base 110_4, between the substrate base 110_4 and the substrate base 110_5, and on the lower side of the substrate base 110_5.

To electrically connect the connection pads 412c, 412d, 414c, and 414d and the conductive line 416, or conductive lines disposed among different substrate bases, a plurality of conductive vias 412 and 414 penetrating at least part of the substrate base 110 may be further included, Some of the conductive vias may be electrically connected to the ground plane layer.

The conductive line 416, the conductive vias 412 and 414, and/or the ground plane layer may be made of a conductive material, for example, copper, nickel, stainless steel, or beryllium copper.

A first end of the conductive line 416 may be electrically connected to the connection pad 412c through the first conductive via 412, and a second end of the conductive line 416 may be electrically connected to the connection pad 414c through the second conductive via 414. The first conductive via 412 and the second conductive via 414 may each penetrate the substrate bases 110_1, . . . , 110_5.

A first portion 412a of the first conductive via 412 penetrates the substrate bases 110_1, 110_2, and 110_3 and is connected to the conductive line 416 between the substrate base 110_3 and the substrate base 110_4. A first portion 414a of the second conductive via 414 penetrates the substrate bases 110_1, 110_2, and 110_3 and is connected to the conductive line 416 between the substrate base 110_3 and the substrate base 110_4.

A second portion 412b of the conductive via 412 penetrates the substrate bases 110_4 and 110_5 and is connected to the conductive line 416, A second portion 414b of conductive via 412 penetrates the substrate bases 110_4 and 110_5 and is connected to the conductive line 416. In addition, the second portion 412b of the conductive via 412 and the second portion 414b of the conductive via 414 are via stubs, which may be removed by a process such as a back drilling. However, a manufacturing cost by the additional process may be increased. According to an embodiment, the process for removing the via stubs 412b and 414b may be omitted by connecting the open stub to the conductive line 416.

Referring to FIG. 4, the conductive line 416 may be connected to the open stub 418 on the connector TP. The open stub 418 extends by a predetermined length L1 from the connector TP. The open stub 418 may be positioned between the substrate base 110_3 and the substrate base 110_4.

According to an embodiment of the present inventive concept, by forming a low pass filter by connecting the open stub 418 to the conductive pattern 410 for connecting the conductive vias 412 and 414 to each other, the influence caused by the via stubs 412b and 414b may be reduced, and transmission of a low-frequency component of a signal through the conductive pattern 410 may be increased.

The low pass filter will now be described with reference to FIG. 5.

Figure 5:
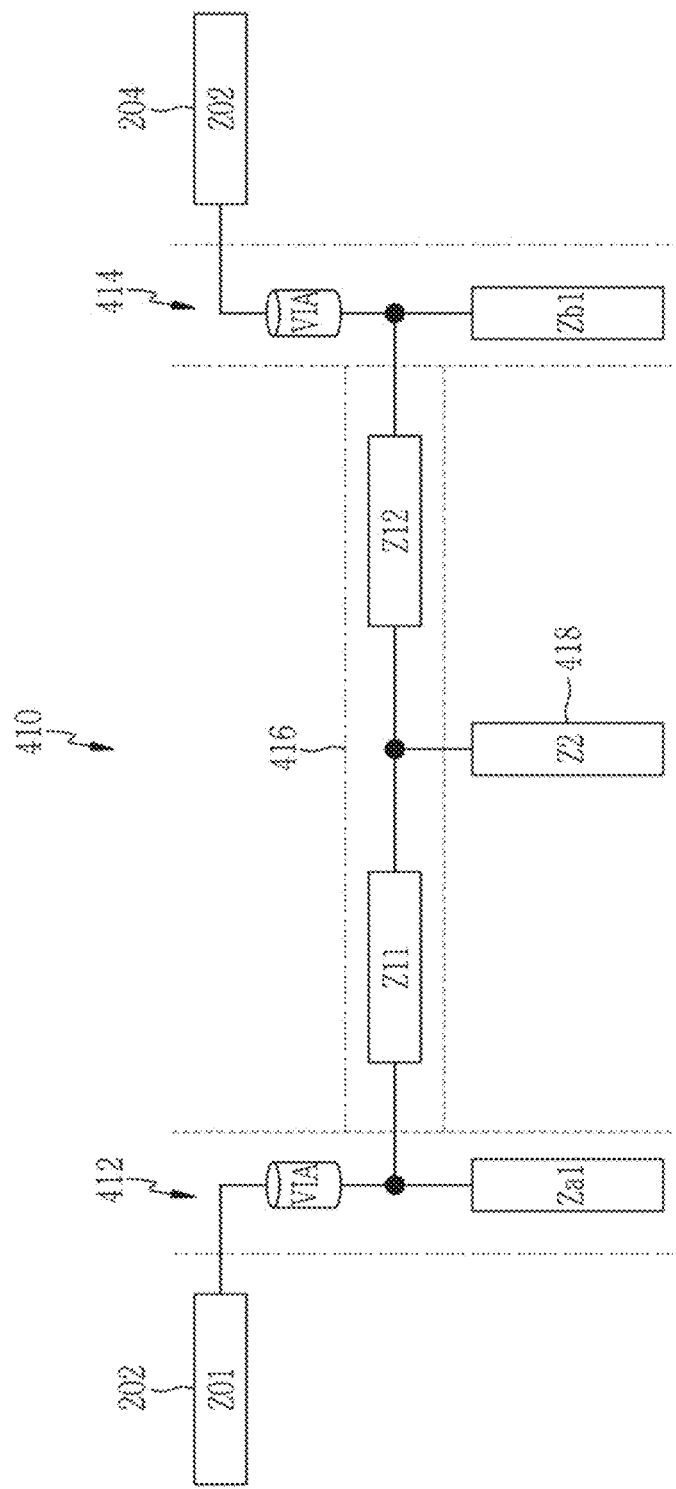
FIG. 5 shows a filter of an electronic device according to an embodiment.

FIG. 5 shows a filter of an electronic device according to an embodiment.

Referring to FIG. 5, conductive vias 412 and 414, a conductive line 416, and an open stub 418 form a $3^{rd}$-order low pass filter.

A terminal 202 of the first semiconductor chip may be connected to a terminal 204 of the second semiconductor chip by a conductive pattern 410.

The impedance value toward the terminal 202 of the first semiconductor chip from the conductive pattern 410 may be Z01, and the impedance value for the terminal 204 of the second semiconductor chip may be Z02 on the conductive pattern 410. Z01 and Z02 may have substantially equivalent values to each other.

The impedances of the conductive vias 412 and 414 are Za1 and Zb1 which may have substantially equivalent values to each other. Here, Za1, Zb1, Z01, and Z02 may have substantially equivalent values to each other.

The impedance of the conductive line 416 may be divided into Z11 and Z12 with reference to a node to which the open stub 418 is connected. The impedance Z11 and the impedance Z12 may be substantially 1:1. The impedance Z11 and the impedance Z12 may have about twice the impedance Z01 or Z02. The impedance Z2 of the open stub 418 may have about ½ of the value of the impedance Z01 or Z02. The impedance relationship may be expressed as in Equation 1.

$$Z01 = Z02,$$
$$Za1 = Zb1 = Z01$$
$$Z11 = Z12 = 2Z01,$$
$$Z2 = \frac{1}{2}Z01$$

(Equation 1)

The impedance Z2 of the open stub 418, the impedance Z11 or Z12 of the conductive line 416 divided by the open stub 418, and the impedances Za1 and Zb1 of the via stub have been described in the above, and when the respective impedances do not satisfy Equation 1, the open stub 418 is connected to the conductive line 416 of which both ends the via stub is connected to, thereby realizing a $3^{rd}$-order Butterworth filter.

Conductive patterns according to an embodiment will now be described with reference to FIG. 6 and FIG. 7.

Figure 6:
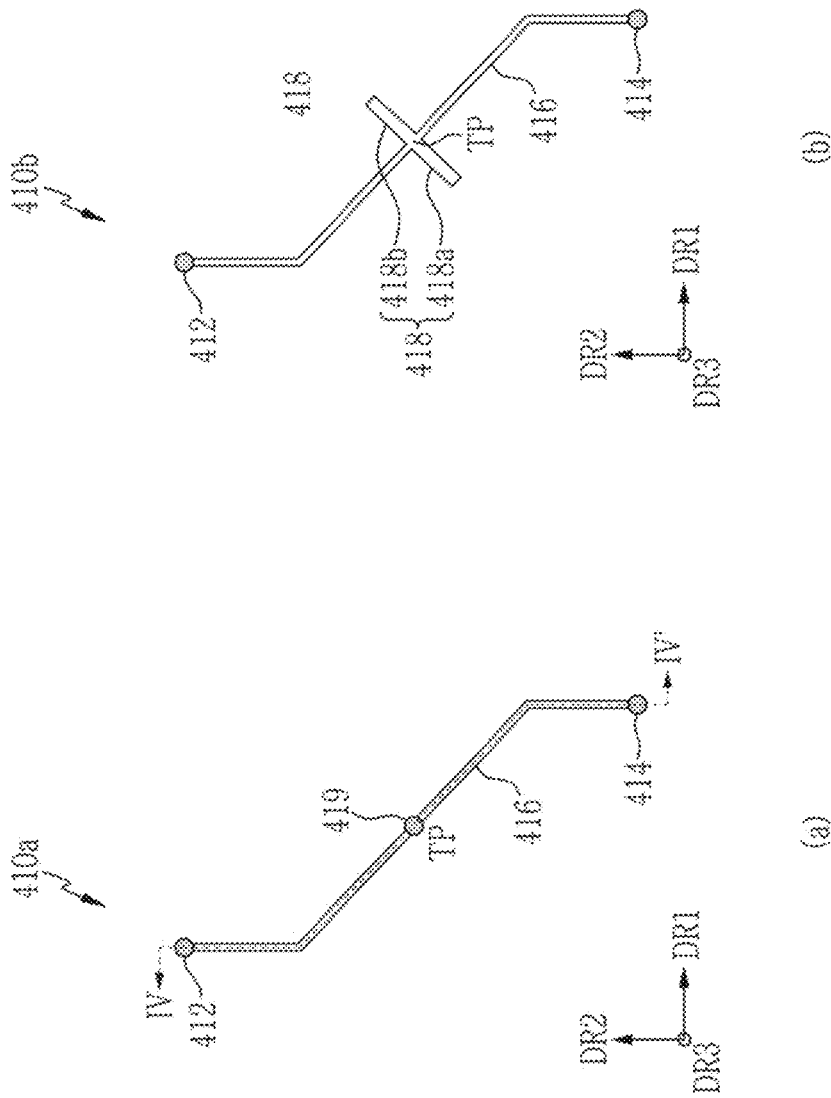
FIG. 6 shows a layout of conductive patterns on a base substrate of an electronic device according to an embodiment.

FIG. 6 shows a layout of conductive patterns on a base substrate of an electronic device according to an embodiment.

As shown in (a) of FIG. 6, the conductive pattern 410a may include a first conductive via 412, a second conductive via 414, a conductive line 416 connected to the first conductive via 412 and the second conductive via 414, and an open stub 419 connected to the conductive line 416.

The first conductive via 412, the second conductive via 414, and the conductive line 416 shown in FIG. 6 are similar to the first conductive via 412, the second conductive via 414, and the conductive line 416 described with reference to FIG. 2, so no detailed descriptions thereof will be provided to prevent providing repetitive descriptions.

The open stub 419 may be a conductive via positioned in the connector TP of the conductive line 416 between the first conductive via 412 and the second conductive via 414. The connector TP may be positioned substantially in the middle of the conductive line 416.

For example, the connector TP may be a point for substantially dividing the conductive line 416 into two portions. For example, the two portions of the conductive line 416 may be substantially equal to each other. The impedance value of the conductive line 416 between the connector TP and the first conductive via 412 may be substantially equivalent to the impedance value of the conductive line 416 between the connector TP and the second conductive via 414.

The open stub 419 may be electrically connected to the conductive line 416. This will be described with reference to FIG. 7.

Figure 7:
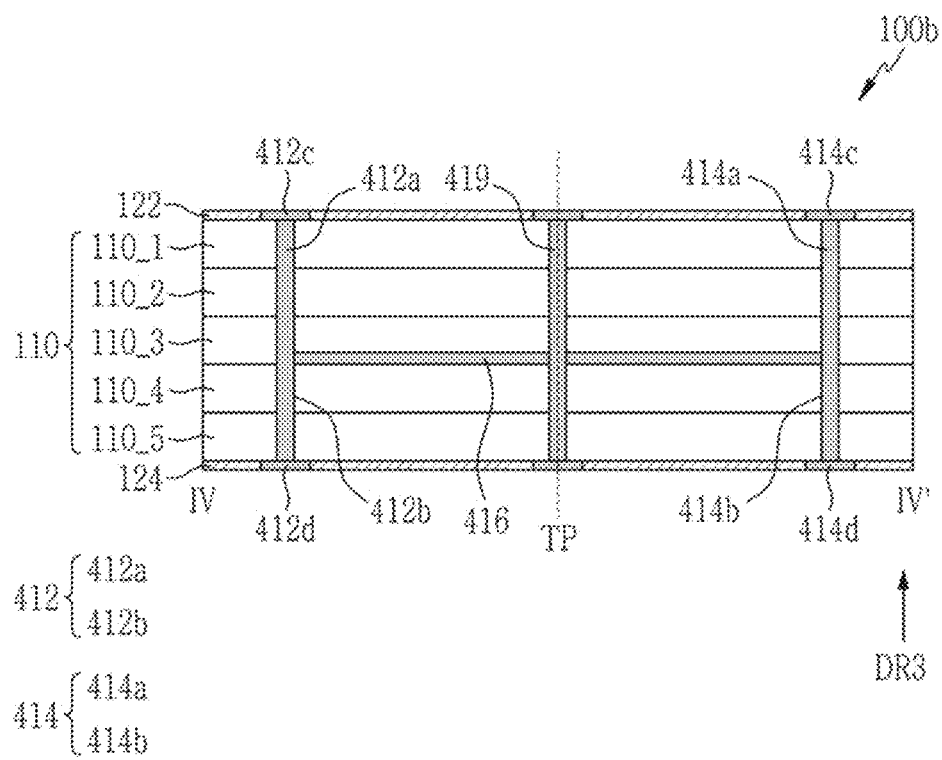
FIG. 7 shows a cross-sectional view of an electronic device of FIG. 6 with respect to a line IV-IV'.

FIG. 7 shows a cross-sectional view of an electronic device of FIG. 6 with respect to a line IV-IV.

As shown in FIG. 7, a conductive line 416 for electrically connecting spaces between the connection pads 412c, 412d, 414c, and 414d may be positioned on the base substrate 100b.

The base substrate 100b, the connection pads 412c, 412d, 414c, and 414d, the first conductive via 412, the second conductive via 414, and the conductive line 416 are respectively similar to the base substrate 100a, the connection pads 412c, 412d, 414c, and 414d, the first conductive via 412, the second conductive via 414, and the conductive line 416 described with reference to FIG. 3, so no detailed descriptions thereof will be provided to prevent providing repetitive descriptions.

The conductive line 416 may be connected to the open stub 419 at the connector TP. The open stub 419 may be a conductive via penetrating the substrate bases 110_1, . . . , 110_5. A depth of the open stub 419 in a third direction DR3 may be equivalent to that of the first conductive via 412 and the second conductive via 414. The conductive line 416 may be disposed on one side of the substrate base 110_4 and may be connected to the open stub 419.

The impedance value of the open stub 419 relates to the impedance value of the conductive line 416. For example, the impedance value of the conductive line 416 may be a multiple of the impedance value of the open stub 419. For example, the impedance value of the open stub 419 may be about ½ the entire impedance value of the conductive line 416. Hence, a cross-section of the open stub 419 relates to the impedance value of the conductive line 416.

As shown in (b) of FIG. 6, the conductive pattern 410 may include a first conductive via 412, a second conductive via 414, a conductive line 416 connected to the first conductive via 412 and the second conductive via 414, and an open stub 418 connected to the conductive line 416.

The open stub 418 may be connected to the connector TP of the conductive line 416 between the first conductive via 412 and the second conductive via 414. The open stub 418 may include a first open stub 418a and a second open stub 418b extending in different directions with respect to each other. The first open stub 418a and the second open stub 418b may be impedances coupled in parallel to the conductive line 416 at the connector TP.

The impedance values of the first open stub 418a and the second open stub 418b relate to the impedance value of the conductive line 416. For example, the impedance value of the conductive line 416 may be a multiple of a combined impedance value of the first open stub 418a and the second open stub 418b. For example, the combined impedance value of the first open stub 418a and the second open stub 418b may be ½ of the entire impedance value of the conductive line 416. Therefore, respective lengths and widths of the first open stub 418a and the second open stub 418b relate to the impedance value of the conductive line 416.

The respective lengths and widths of the first open stub 418a and the second open stub 418b may be identical to each other so that the first open stub 418a and the second open stub 418b may have the same impedance value. However, when the first open stub 418a and the second open stub 418b have substantially equivalent impedance values, the lengths and the widths of the first open stub 418a and the second open stub 418b may be different from each other.

The first open stub 418a and the second open stub 418b may extend in the direction that crosses the direction in which the conductive line 416 extends. The first open stub 418a and the second open stub 418b may extend in opposite directions with respect to each other, and an angle between the first open stub 418a and the second open stub 418b may be greater than 0 degrees and equal to or less than 180 degrees.

The conductive line 416, the first open stub 418a, and the second open stub 418b may be positioned on a same layer.

A conductive pattern according to an embodiment will now be described with reference to FIG. 8 and FIG. 9.

FIG. 8 shows a layout of conductive patterns on a base substrate of an electronic device according to an embodiment.

As shown in FIG. 8, the conductive line 816 may be disposed near at least one of the conductive lines 826 and 836. The open stub 818 may extend in a direction that crosses the direction in which the conductive line 816 extends from the connector TP of the middle of the conductive line 816. The open stub 818 may then extend to be spaced from the conductive line provided nearest the connector TP. For example, the open stub 818 may be spaced apart from at least one of the conductive lines 826 or 836.

For example, when a distance to the conductive line 826 from the connector TP is given as D1, and a distance to the conductive line 836 from the connector TP is given as D2 (D1>D2), the open stub 818 may extend in an opposite direction to the direction that faces the conductive line 836 at the connector TP. Here, the open stub 818 extends in a direction that forms the angle of 180 degrees with respect to the direction that faces the conductive line 836, and depending on embodiments, the open stub 818 may extend in a direction that forms the angle of about 90 degrees to about 270 degrees with respect to the direction that faces the conductive line 836.

When the conductive line 816 is disposed near one conductive line 836, the open stub 818 may extend to be spaced from one conductive line 836 at the connector TP in a similar way.

As the open stub 818 is spaced from the adjacent conductive line 836, an influence of signal coupling caused by the conductive line 836 may be minimized.

Figure 9:
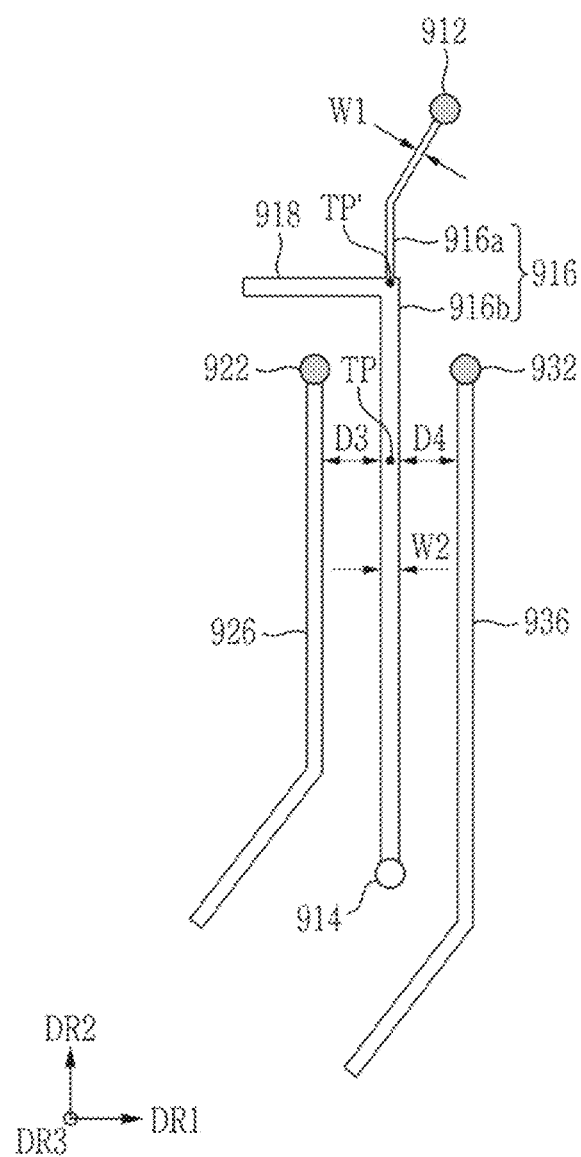
FIG. 9 shows a layout of conductive patterns on a base substrate of an electronic device according to an embodiment.

FIG. 9 shows a layout of conductive patterns on a base substrate of an electronic device according to an embodiment.

As shown in FIG. 9, the conductive line 916 may be disposed near at least one of the conductive lines 926 and 936. When a length of the open stub 918 is greater than the distances D3 and D4 to the respective conductive lines 926 and 936 from the connector TP (e.g., a first connector TP') of the middle of the conductive line 916, the open stub 918 may be positioned on the other connector TP' (e.g., a second connector TP') of the conductive line 916.

The impedance value of the conductive line 916a between the connector TP' and the first conductive via 912 may be substantially equivalent to the impedance value of the conductive line 916b between the connector TR' and the second conductive via 914. As a length of the conductive line 916a is less than a length of the conductive line 916b, a width W1 of the conductive line 916a may be less than a width W2 of the conductive line 916b.

A signal transmission characteristic of a conductive pattern of an electronic device according to an embodiment will now be described with reference to FIG. 10.

Figure 10:
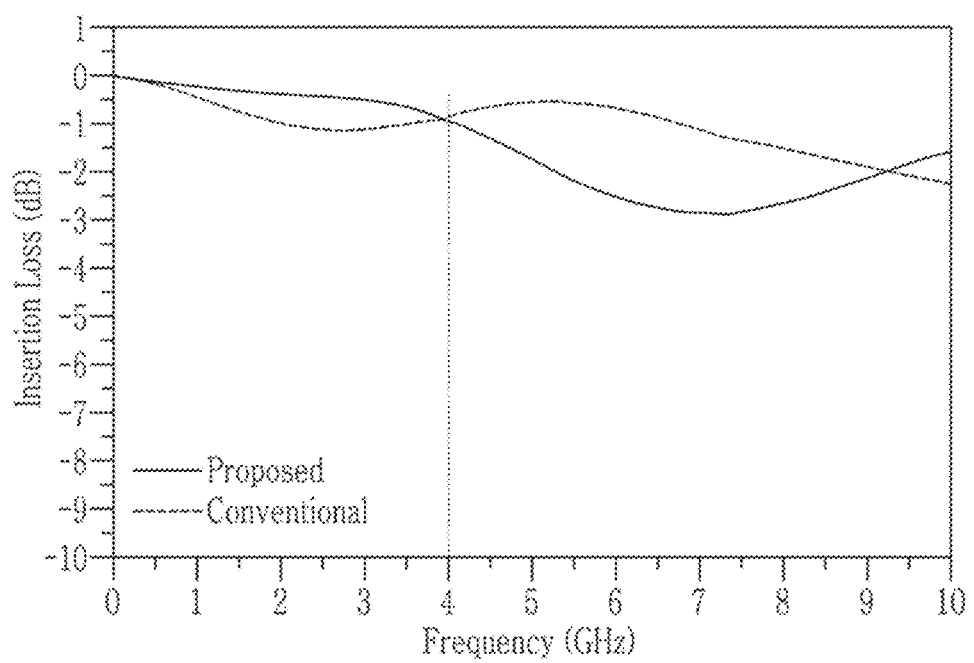
FIG. 10 shows a graph on signal transmission characteristics of conductive patterns of an electronic device according to an embodiment.

FIG. 10 shows a graph of signal transmission characteristics of conductive patterns of an electronic device according to an embodiment.

As shown in FIG. 10, it is found that the signal transmission characteristic of the conductive pattern according to an embodiment is improved compared to the conductive pattern for connecting the conductive via with no conventional open stub in the low frequency bandwidth (e.g., 0 to 4 GHz). As bandwidths that are above about 4 GHz are not the bandwidths in which actual electronic devices are operated, their signal transmission characteristic may be deteriorated compared to prior art.

Table 1 expresses comparison of signal transmission characteristics of the conductive pattern according to an embodiment and a conventional conductive pattern by using eye parameters.

TABLE 1

| | Speed | | | |
| --- | --- | --- | --- | --- |
| | 5.2 Gbps | | 6 Gbps | |
| | Eye parameters | | | |
| | Eye Height (mV) | Eye Width (ps) | Eye Height (mV) | Eye Width (ps) |
| Conventional | 438.3 | 136 | 425.6 | 114.8 |
| Proposed | 501.8 | 142.2 | 465.8 | 114.1 |

As expressed in Table 1, it is found that eye width E is partly reduced at 6 Gbps regarding the conductive pattern according to an embodiment, and it is found in another case that the parameters of eye height (EH) and EW are improved compared to the conventional conductive pattern. According to the present embodiment, as a channel bandwidth of the conductive pattern is increased through a simple structure and quality of a received signal is improved so manufacturing time and cost may be reduced.

A conductive pattern according to an embodiment will now be described with reference to FIG. 11 and FIG. 12.

Figure 11:
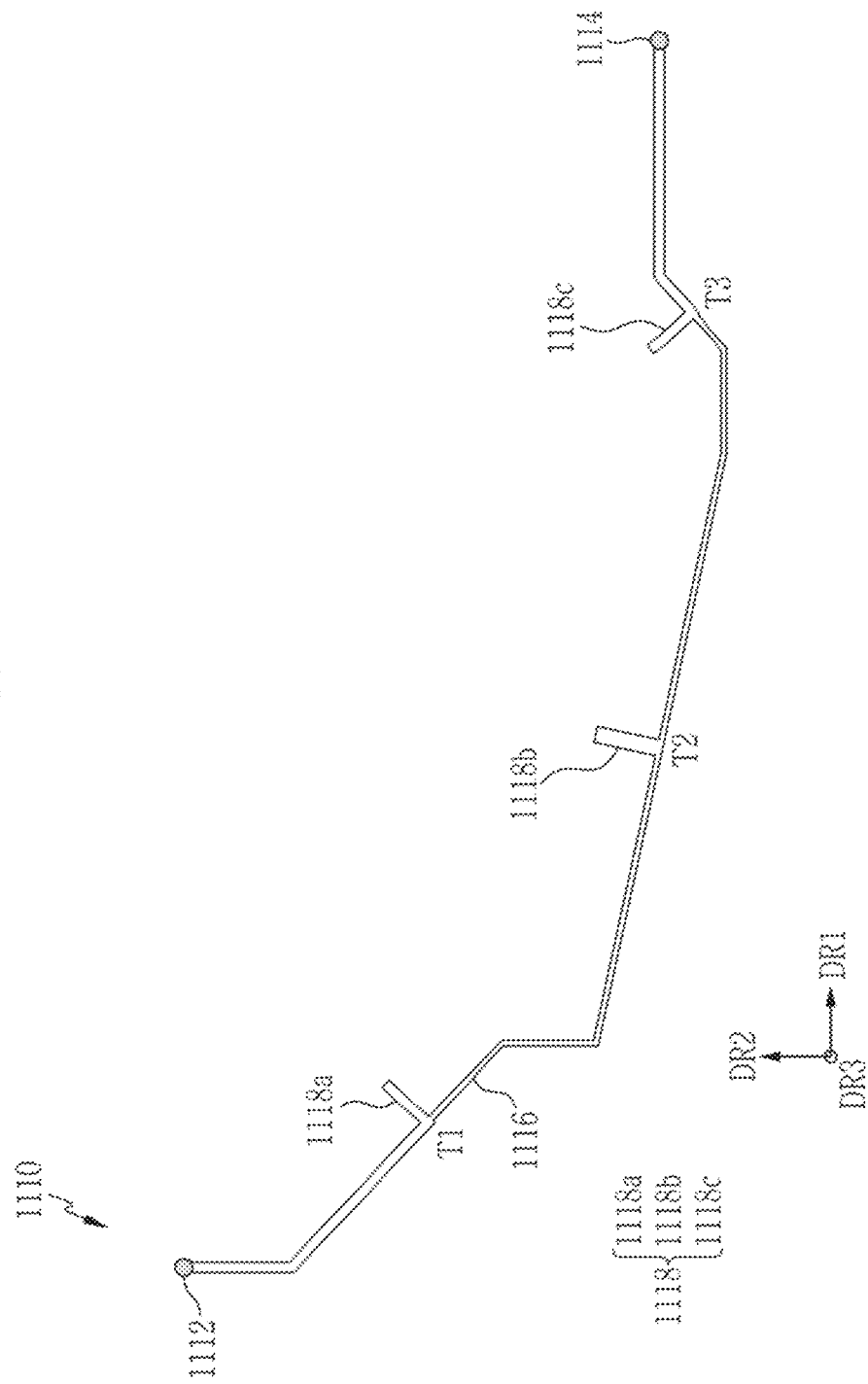
FIG. 11 shows a layout of conductive patterns on a base substrate of an electronic device according to an embodiment.

FIG. 11 shows a layout of conductive patterns on a base substrate of an electronic device according to an embodiment.

As shown in FIG. 11, the conductive pattern 1110 may include a first conductive via 1112, a second conductive via 1114, a conductive line 1116 connected to the first conductive via 1112 and the second conductive via 1114, and a plurality of open stubs 1118a, 1118b, and 1118c connected to the conductive line 1116.

When the conductive line 1116 is longer than the open stub 1118, the length and the width of the open stub 1118, which are for satisfying the impedance of the open stub 1118 that is determined based on the impedance of the conductive line 1116, have big values. Accordingly, it may be difficult to realize the low pass filter through one open stub on the base substrate of which an area is limited and on which other conductive patterns are integrated.

A $5^{th}$ order low pass filter is realized by connecting the open stubs 1118a, 1118b, and 1118c to the conductive line 1116. The open stubs 1118a, 1118b, and 1118c are spaced from each other. Of the open stubs 1118a, 1118b, 1118c, the impedances of the open stubs 1118a and 1118c disposed closest to the first conductive via 1112 and the second conductive via 1114, respectively, may be equivalent to each other, and may be greater than that of the open stub 1118b.

A length of the conductive line 1116 between the first conductive via 1112 and the first connector T1 may be substantially equivalent to a length of the conductive line 1116 between the third connector T3 and the second conductive via 1114. A length of the conductive line 1116 between the first connector T1 and the second connector T2 may be substantially equivalent to a length of the conductive line 1116 between the second connector T2 and the third connector T3.

When the length of the conductive line 1116 between the first conductive via 1112 and the first connector T1, the length of the conductive line 1116 between the first connector T1 and the second connector T2, the length of the conductive line 1116 between the second connector T2 and the third connector T3, and the length of the conductive line 1116 between the third connector T3 and the second conductive via 1114 are substantially equivalent to each other, each of the width of the conductive line 1116 between the first conductive via 1112 and the first connector T1 and the width of the conductive line 1116 between the third connector T3 and the second conductive via 1114 may be greater than each of the width of the conductive line 1116 between the first connector T1 and the second connector T2 and the width of the conductive line 1116 between the second connector T2 and the third connector T3.

The open stubs 1118a, 1118b, and 1118c may be connected to a plurality of connectors T1, T2, and T3 of the conductive line 1116 between the first conductive via 1112 and the second conductive via 1114. The impedance value of the conductive line 1116 between the first conductive via 1112 and the first connector T1 may be substantially equivalent to the impedance value of the conductive line 1116 between the third connector T3 and the second conductive via 1114. The impedance value of the conductive line 1116 between the first connector T1 and the second connector T2 may be substantially equivalent to the impedance value of the conductive line 1116 between the second connector T2 and the third connector T3.

The impedance values of the open stubs 1118a, 1118b, and 1118c relate to the impedance value of the conductive line 1116. This will be described in a later portion of the present specification with reference to FIG. 12.

An input/output impedance value of the semiconductor chip 200 connected to the first conductive via 1112 may be substantially equivalent to an input/output impedance value of the semiconductor chip 200 connected to the second conductive via 1114.

A low pass filter configured with the conductive pattern 1110 will now be described with reference to FIG. 5.

Figure 12:
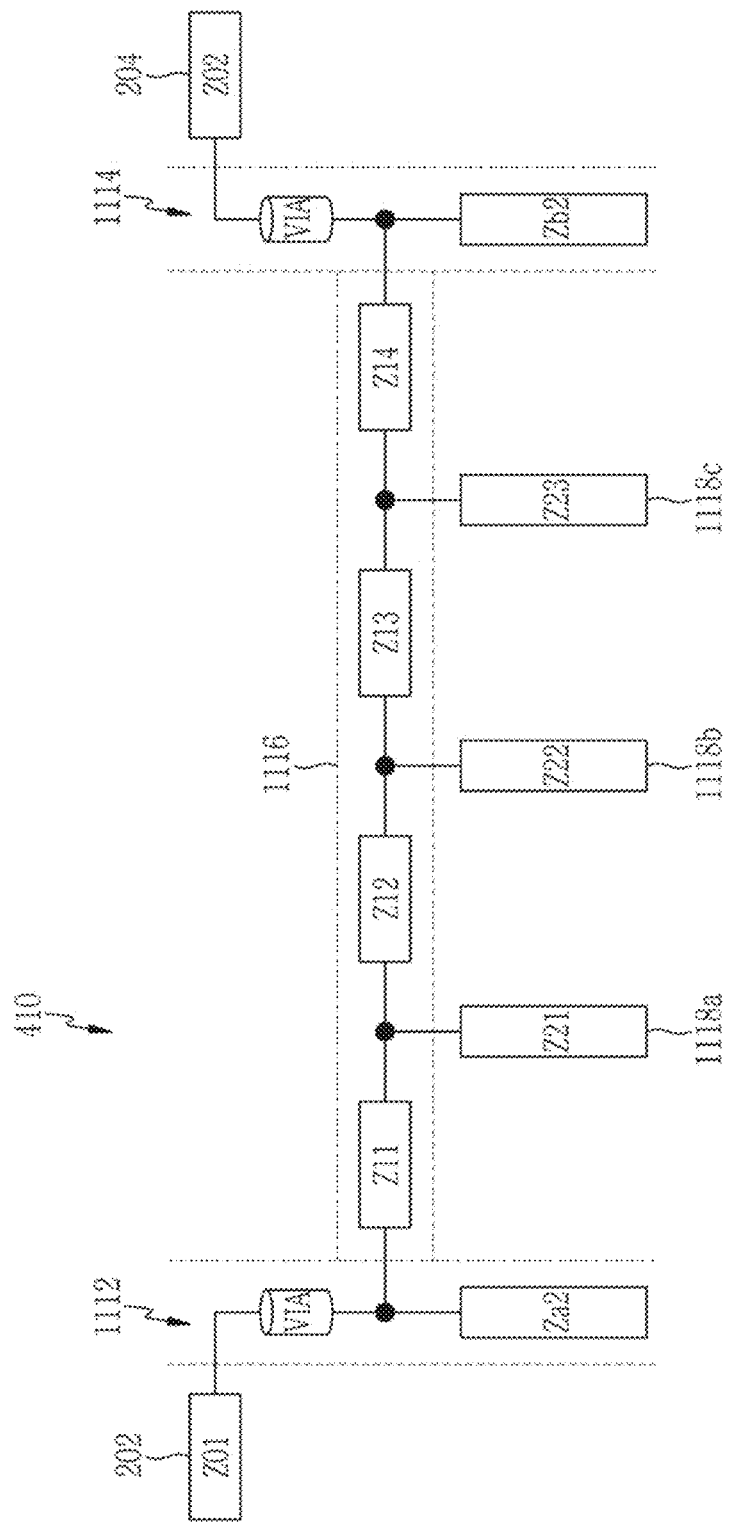
FIG. 12 shows a filter of an electronic device according to an embodiment.

FIG. 12 shows a filter of an electronic device according to an embodiment.

Referring to FIG. 5, the terminal 202 of the first semiconductor chip may be connected to the terminal 204 of the second semiconductor chip by the conductive pattern 1110.

The impedance value toward the terminal 202 of the first semiconductor chip from the conductive pattern 1110 may be Z01, and the impedance value toward the terminal 204 of the second semiconductor chip from the conductive pattern 1110 may be Z02. Z01 and Z02 may have substantially equivalent values.

The impedances of the conductive vias 1112 and 1114 are Za2 and Zb2 which may have substantially equivalent values.

The impedance of the conductive line 1116 may be divided into Z11, Z12, Z13, and Z14 with reference to a node to which the open stubs 1118a, 1118b, and 1118c are connected. The impedance Z11 and the impedance Z14 may be substantially 1:1. The impedance Z12 and the impedance Z13 may be substantially 1:1, and may have about twice the impedance Z21 and the impedance Z23. The impedance Z21 of the open stub 1118a and the impedance Z23 of the open stub 1118c may be substantially 1:1. The impedance Z22418 may have about ½ of the value of the impedance Z01 or the impedance Z02. The impedance relationship may be expressed as in Equation 2.

$$Z01 = Z02, \quad \text{(Equation 2)}$$
$$Za2 = Zb2 = 3.618\ Z01$$
$$Z11 = Z14 = 1.38\ Z01,$$
$$Z12 = Z13 = 1.84\ Z01,$$
$$Z21 = Z23 = 0.92\ Z01,$$
$$Z22 = \frac{1}{2}Z01$$

Lengths of the open stubs 1118a, 1118b, and 1118c may be substantially equivalent to each other, and widths of the open stubs 1118a, 1118b, and 1118c may be different from each other depending on a relationship of Equation 2. Widths of the open stubs 1118a, 1118b, and 1118c may be substantially equivalent to each other, and lengths of the open stubs 1118a, 1118b, and 1118c may be different from each other depending on a relationship of Equation 2.

The lengths and the widths of the conductive line 1116 between the first conductive via 1112 and the first connector T1, the conductive line 1116 between the first connector T1 and the second connector T2, the conductive line 1116 between the second connector T2 and the third connector T3, and the conductive line 1116 between the third connector T3 and the second conductive via 1114 may have different values from each other depending on the relationship of Equation 2.

The impedances Z21, Z22, and Z23 of the open stubs 1118a, 1118b, and 1118c, the impedances Z11, Z12, Z13, and Z14 of the conductive line 1116 divided by the open stubs 1118a, 1118b, and 1118c, and the impedances Za2 and Zb2 of the via stub have been described in the above, and when the respective impedances do not satisfy Equation 2, a $5^{th}$-order Butterworth filter may be realized by connecting the open stubs 1118a, 1118b, and 1118c to the conductive line 1116 of which both ends the via stub is connected to. A Butterworth filter of a $7^{th}$ order or more than that may be realized according to the above-noted method for realizing the $3^{rd}$-order Butterworth filter and the $5^{th}$-order Butterworth filter.

A conductive pattern of a main board according to an embodiment will now be described with reference to FIG. 13 and FIG. 14.

Figure 13:
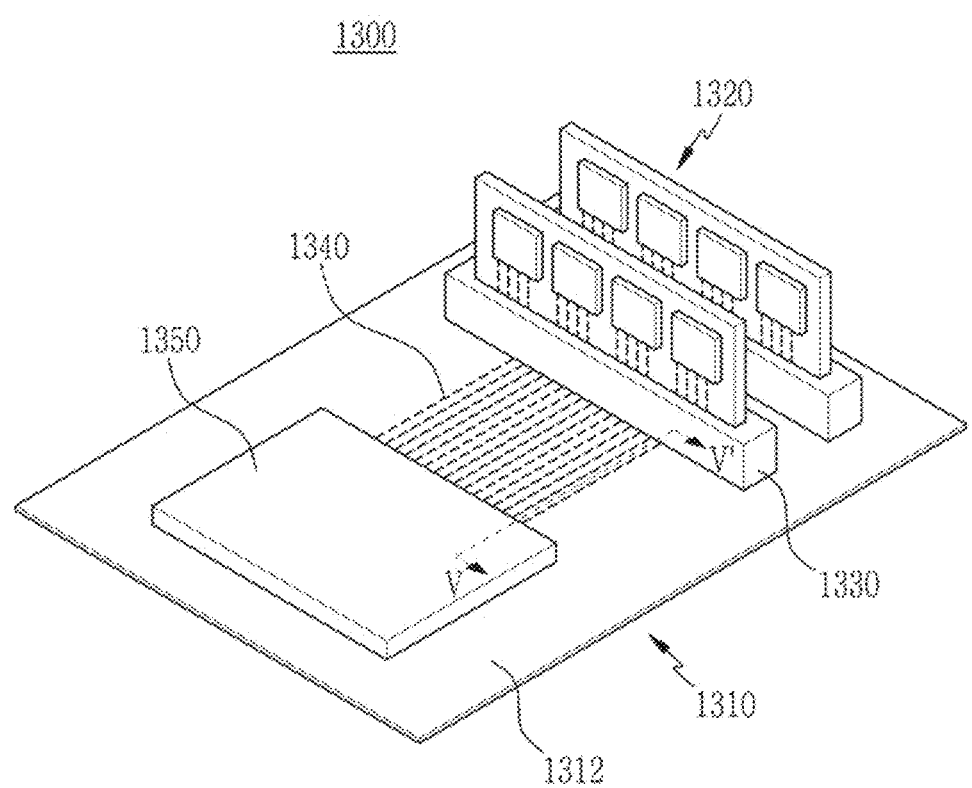
FIG. 13 shows a perspective view of an electronic device according to an embodiment.

FIG. 13 shows a perspective view of an electronic device according to an embodiment.

As shown in FIG. 13, the electronic device 1300 includes a main board 1310 and at least one memory module 1320 connected to the main board 1310.

The main board 1310 includes a base substrate 1312, and a controller chip 1350 connected to the base substrate 1312. The base substrate 1312 may, for example, have a similar configuration to those of the base substrates 100a and 100b described with reference to FIG. 3, FIG. 4, and FIG. 7, so no detailed descriptions thereof will be provided to prevent providing repetitive descriptions.

A plurality of conductive patterns 1340 may be disposed in the base substrate 1312, The controller chip 1350 may be at least one of various processing units such as a central processing unit (CPU), an application processor (AP), or a graphics processing unit (GPU).

At least one memory slot 1330 connected to the base substrate 1312 may be attached to the main board 1310. At least one memory module 1320 may be fastened to at least one memory slot 1330 and may be connected to the main board 1310. The memory module 1320 may, for example, be the electronic device 10 shown in FIG. 1.

The controller chip 1350 may be connected to the at least one memory slot 1330 through the conductive patterns 1340.

A configuration of the conductive pattern 1340 will now be described with reference to FIG. 14.

Figure 14:
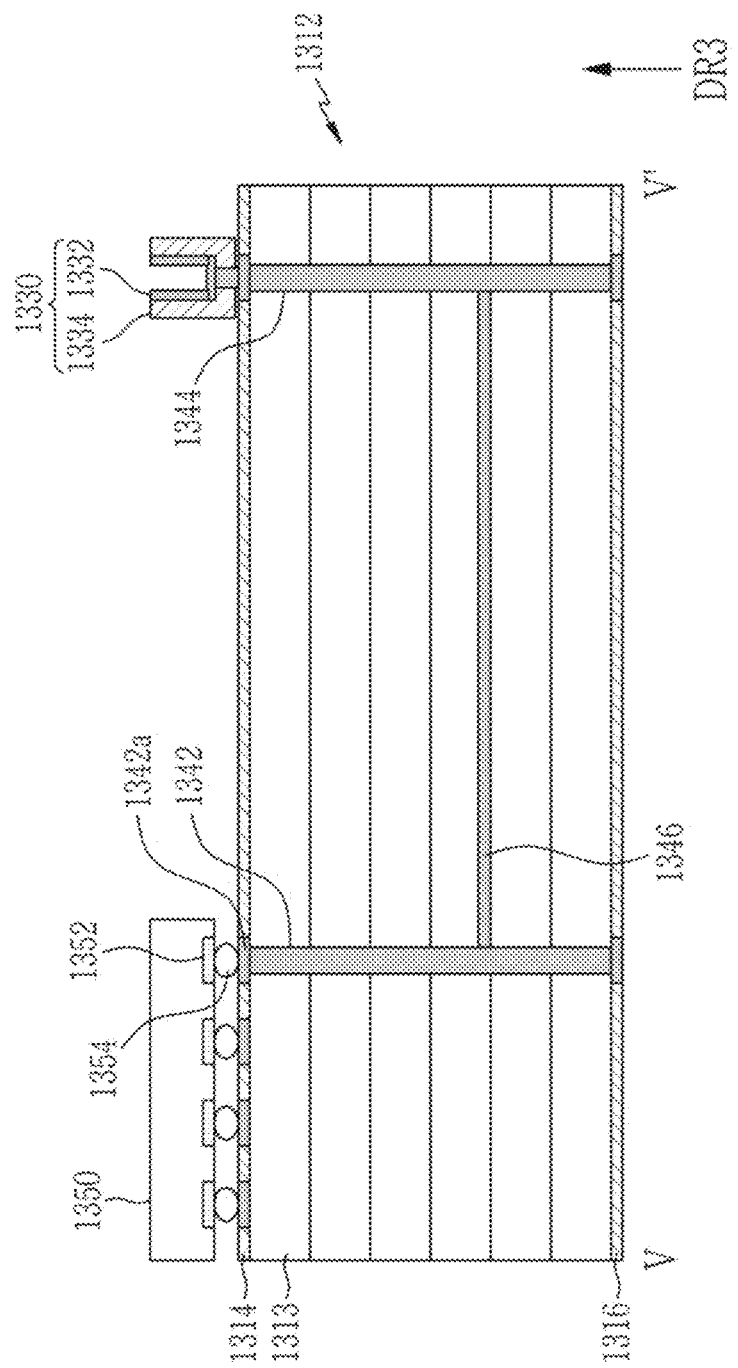
FIG. 14 shows a cross-sectional view of an electronic device of FIG. 13 with respect to a line V-V'.

FIG. 14 shows a cross-sectional view of an electronic device of FIG. 13 with respect to a line V-V'.

As shown in FIG. 14, the electronic device includes a base substrate 1312, a controller chip 1350 attached to the base substrate 1312, and at least one memory slot 1330. The memory slot 1330 may include a terminal portion 1332 and a slot body portion 1334 for supporting the terminal portion 1332. The memory module 1320 shown in FIG. 13 may be electrically connected to the terminal portion 1332, may be supported by the slot body portion 1334, and may be connected to the main board 1310.

A plurality of connection pads 1342a of the base substrate 1312 may be electrically connected to a plurality of chip connection pads 1352 of the controller chip 1350 through a chip connecting member 1354. For example, chip connecting member 1354 may be a solder ball or a bump, and without being limited thereto, for example, the chip connecting member 1354 may be a bonding wire.

A conductive line 1346, which electrically connects the connection pad 1342a and the terminal portion 1332 to each other, may be positioned on the base substrate 1310. The conductive line 1346 may have at least one open stub, which is similar to the configuration of the open stub described with reference to FIG. 2, FIG. 6, FIG. 8, FIG. 9, and FIG. 11, and will not be described to prevent providing repetitive descriptions.

A method for manufacturing an electronic device according to an embodiment will now be described with reference to FIG. 15 and FIG. 16.

Figure 15:
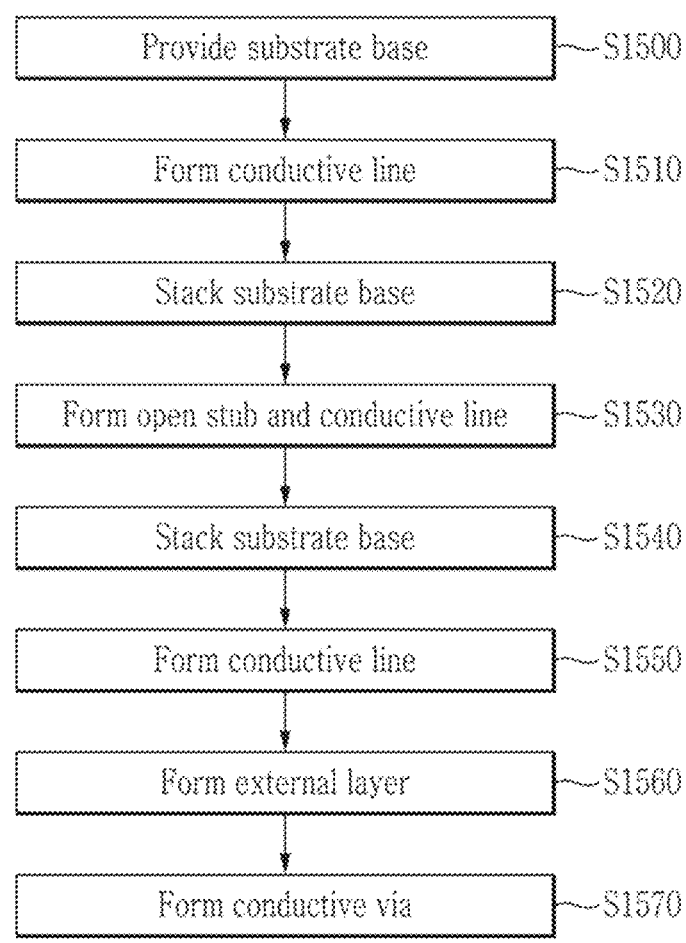
FIG. 15 shows a flowchart of a method for manufacturing an electronic device according to an embodiment.

FIG. 15 shows a flowchart of a method for manufacturing an electronic device according to an embodiment.

A first substrate base is provided (S1500). A conductive line is formed on an upper side and/or a lower side of the first substrate base (S1510). The conductive line may be formed by stacking a metal layer on one side of the first substrate base and partly removing the same. The conductive line is formed to connect conductive vias to each other, and the conductive vias are to be formed in a next process.

A second substrate base may be stacked in a thickness direction on one side of the first substrate base (S1520). A conductive line having at least one open stub is formed on one side of the second substrate base (S1530). When the open stub is formed, the lengths of the conductive line portions divided by the connector on which the open stub is formed may be substantially equivalent to each other. The impedances of the divided conductive line portions may be substantially equivalent to each other. For example, when one open stub is formed, the open stub may be formed in the middle of the conductive line, and the impedances of the two portions of the conductive lines divided by the open stub are substantially equivalent to each other.

A third substrate base is stacked in the thickness direction on one side of the second substrate base (S1540). A conductive line is formed on an upper side of the third substrate base (S1550).

An external layer is formed (S1560), For example, a solder resist layer is formed. Conductive vias are formed so that they may be connected to the conductive lines formed by at least one of the stages S1510, S1530, and S1550 (S1570). The conductive vias may penetrate the first to third substrate bases and the solder resist layer.

By the above-noted method, an open stub bifurcated from the conductive line may be formed on a same layer as the conductive line connecting two conductive vias.

Figure 16:
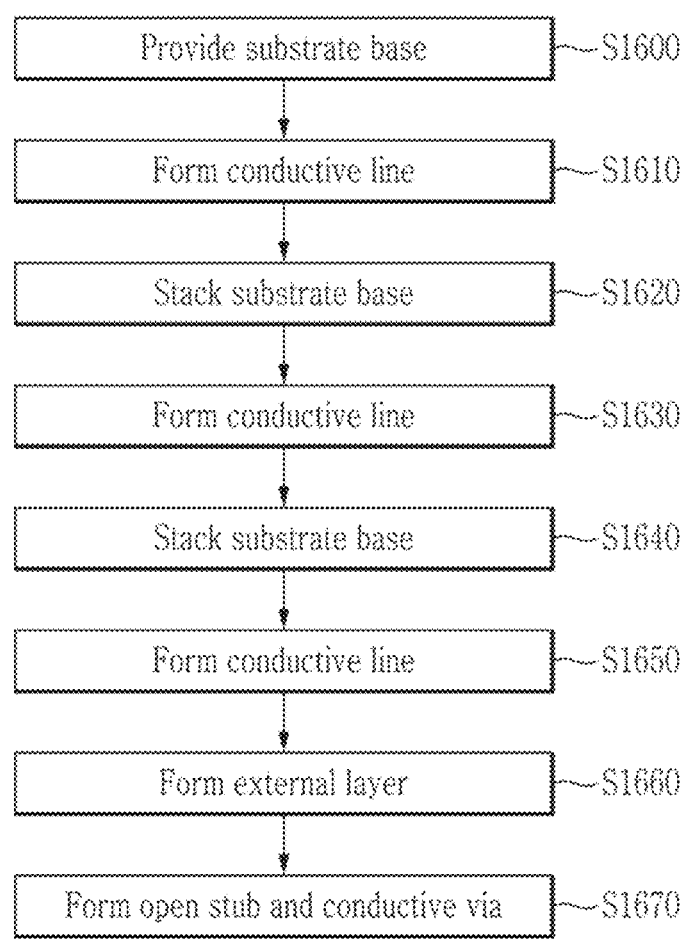
FIG. 16 shows a flowchart of a method for manufacturing an electronic device according to an embodiment.

FIG. 16 shows a flowchart of a method for manufacturing an electronic device according to an embodiment.

The stage S1600, the stage S1610, the stage S1620, the stage S1640, the stage S1650, and the stage S1660 are similar to the stage S1500, the stage S1510, the stage S1520, the stage S1540 the stage S1550, and the stage S1560 of FIG. 15 so no descriptions thereof will be provided to prevent providing repetitive descriptions.

After the stage S1620, a conductive line is formed on the substrate base without forming an additional open stub (S1630).

After the stage S1660, an open stub and conductive vias are formed to be respectively connected to the conductive lines formed in at least one of the stage S1616, the stage S1630, and the stage S1650 (S1670). The lengths of the conductive line portions divided by the connector on which the open stub is formed may be substantially equivalent to each other. The impedances of the divided conductive line portions may be substantially equivalent to each other. For example, when one open stub is formed, the open stub may be formed in the middle of the conductive line, and the impedance of the two portions of the conductive line divided by the open stub may be substantially equivalent to each other.

By the above-noted method, the open stub may be formed with the conductive via penetrating the layer on which the conductive line, which connects the two conductive vias to each other, may be formed.

According to an embodiment, a reflection of signals by conductive vias used in a multilayered board may be prevented.

According to an embodiment, an influence of a signal coupling among conductive lines on a multilayered board may be reduced.

While the present invention has been shown and described with reference to the embodiments thereof, it will be apparent to those of ordinary skill in the art that various changes in form and detail may be made thereto without departing from the spirit and scope.

What is claimed is:
1. An electronic device comprising:
    a multilayered base substrate including a plurality of substrate bases stacked on each other;
    a first conductive via and a second conductive via penetrating the substrate bases and spaced from each other,
    a conductive line electrically connecting the first conductive via and the second conductive via to each other and disposed on at least one of the substrate bases of the plurality of substrate bases, wherein the conductive line is disposed between an upper surface and a lower surface of the first conductive via; and
    an open stub including a first end and a second end, wherein the first end is connected to a connector of the conductive line, and the second end is opened.
2. The electronic device of claim 1, wherein
    a length of the conductive line between the first conductive via and the connector are substantially equivalent to a length of the conductive line between the second conductive via and the connector.
3. The electronic device of claim 1, wherein
    the conductive line is divided into divided conductive lines by the connector, and the divided conductive lines have substantially equivalent impedances as each other.

4. The electronic device of claim 3, wherein
the divided conductive lines have different lengths from each other, and the divided conductive lines have different widths from each other.

5. The electronic device of claim 1, wherein
an impedance of the open stub relates to an impedance of the conductive line.

6. The electronic device of claim 5, wherein
an impedance of the open stub is ½ of the impedance of the conductive line.

7. The electronic device of claim 1, wherein
the open stub is disposed on a same layer as the conductive line.

8. The electronic device of claim 1, wherein
the open stub is a conductive via penetrating the plurality of substrate bases.

9. The electronic device of claim 1, wherein
the open stub extends to cross the conductive line.

10. The electronic device of claim 1, wherein
the open stub includes a first open stub and a second open stub, wherein the first open stub extends in a first direction, and the second open stub extends in a second direction different from the first direction.

11. The electronic device of claim 1, further comprising
an additional conductive line disposed on a same layer as the conductive line and disposed adjacent to the conductive line,
wherein the open stub extends from the conductive line and is spaced apart from the additional conductive line.

12. The electronic device of claim 1, wherein
the open stub is a plurality of open stubs, wherein the plurality of open stubs are connected to the conductive line at connectors in the conductive line, wherein the conductive line is divided into a plurality of divided conductive lines by the connectors, wherein lengths of at least two of divided conductive lines of the plurality of divided conductive lines are substantially equivalent to each other.

13. The electronic device of claim 1, wherein
the open stub is a plurality of open stubs, and impedances of at least two open stubs of the plurality of open stubs are substantially equivalent to each other.

14. The electronic device of claim 1, further comprising:
a first semiconductor chip attached to one side of the multilayered base substrate and electrically connected to the first conductive via; and
a second semiconductor chip attached to one side of the multilayered base substrate and electrically connected to the second conductive via.

15. The electronic device of claim 1, further comprising:
a first semiconductor chip attached to one side of the multilayered base substrate and electrically connected to the first conductive via; and
an input/output terminal disposed on one side of the multilayered base substrate and electrically connected to the second conductive via.

16. An electronic device comprising:
a base substrate including a plurality of substrate bases stacked on each other;
at least one semiconductor chip attached to a first side of the base substrate; and
a conductive pattern connected to the at least one semiconductor chip and having a low pass filter,
wherein the low pass filter includes
a first conductive via and a second conductive via penetrating the plurality of substrate bases,
a conductive line disposed between adjacent substrate bases, of the plurality of substrate bases, that are stacked on each other, wherein the conductive line electrically connects the first conductive via and the second conductive via to each other, wherein the conductive line is disposed between an upper surface and a lower surface of the first conductive via, and
at least one open stub including a first end and a second end, wherein the first end is connected to the conductive line at a connector at which the conductive line is divided into substantially equivalent lengths, wherein the second end is opened.

17. The electronic device of claim 16, wherein
the first conductive via includes a first via stub between a substrate base, of the plurality of substrate bases, on which the conductive line is disposed and a first side of the base substrate, and the second conductive via includes a second via stub between the substrate base on which the conductive line is disposed and a second side of the base substrate.

18. The electronic device of claim 16, wherein
the conductive line, the at least one open stub, and the first and second via stubs form the low pass filter.

19. A method for manufacturing an electronic device, comprising:
providing a base substrate including a plurality of substrate bases, wherein a conductive line is formed on a substrate base of the plurality of substrate bases; and
forming conductive vias penetrating the base substrate and connected to respective ends of the conductive line, wherein the conductive line is disposed between an upper surface and a lower surface of the first conductive via,
wherein the conductive line is connected to an open stub of which a first end is opened in substantially a middle of the conductive line.

20. The method of claim 19, further comprising:
before providing the base substrate, forming the conductive line and the open stub on at least one side of the substrate base.

* * * * *